(12) United States Patent
Roberts et al.

(10) Patent No.: US 10,447,273 B1
(45) Date of Patent: Oct. 15, 2019

(54) DYNAMIC VIRTUALIZED FIELD-PROGRAMMABLE GATE ARRAY RESOURCE CONTROL FOR PERFORMANCE AND RELIABILITY

(71) Applicant: Advanced Micro Devices, Inc., Santa Clara, CA (US)

(72) Inventors: David A. Roberts, Boxborough, MA (US); Shenghsun Cho, Boxborough, MA (US)

(73) Assignee: Advanced Micro Devices, Inc., Santa Clara, CA (US)

( * ) Notice: Subject to any disclaimer, the term of this patent is extended or adjusted under 35 U.S.C. 154(b) by 0 days.

(21) Appl. No.: 16/128,014

(22) Filed: Sep. 11, 2018

(51) Int. Cl.
| | |
|---|---|
| G06F 7/38 | (2006.01) |
| H03K 19/173 | (2006.01) |
| H03K 19/177 | (2006.01) |
| G06F 9/48 | (2006.01) |
| G06F 11/30 | (2006.01) |
| G06F 11/34 | (2006.01) |

(52) U.S. Cl.
CPC ..... *H03K 19/17752* (2013.01); *G06F 9/4881* (2013.01); *G06F 11/3024* (2013.01); *G06F 11/3409* (2013.01)

(58) Field of Classification Search
None
See application file for complete search history.

(56) References Cited

U.S. PATENT DOCUMENTS

| | | | |
|---|---|---|---|
| 5,737,631 A | 4/1998 | Trimberger | |
| 6,091,263 A | 7/2000 | New et al. | |
| 6,237,054 B1 | 5/2001 | Freitag | |
| 7,180,324 B2 | 2/2007 | Chan et al. | |
| 7,243,221 B1 | 7/2007 | Ryser | |
| 7,410,884 B2 | 8/2008 | Ramanathan et al. | |
| 7,902,865 B1 | 3/2011 | Cheng et al. | |
| 8,458,720 B2 | 6/2013 | Bansal et al. | |
| 8,928,351 B1 | 1/2015 | Konduru | |
| 10,164,639 B1 * | 12/2018 | Roberts | G06F 15/7892 |
| 2007/0101108 A1 | 5/2007 | Grossman et al. | |

(Continued)

FOREIGN PATENT DOCUMENTS

WO     2017117122 A1     7/2017

OTHER PUBLICATIONS

Asiatici, M., George, N., Vipin, K., Fahmy, S. A., & Ienne, P. (2017). Virtualized execution runtime for FPGA accelerators in the cloud. Ieee Access, 5, 1900-1910.

(Continued)

*Primary Examiner* — Anh Q Tran
(74) *Attorney, Agent, or Firm* — Liang & Cheng, PC (57) ABSTRACT

A method for allocating field-programmable gate array (FPGA) resources includes monitoring a first operating metric for one or more computing devices, identifying a first portion of plurality of macro components of a set of one or more FPGA devices in the one or more computing devices, where the first portion is allocated for implementing one or more user defined functions. The method also includes, in response to a first change in the first operating metric, reallocating the first portion of the macro components for implementing a system function associated with the first operating metric, and generating a first notification indicating the reallocation of the first portion.

21 Claims, 6 Drawing Sheets

(56) References Cited

U.S. PATENT DOCUMENTS

| | | | | |
|---|---|---|---|---|
| 2010/0066408 | A1* | 3/2010 | Kyouno | H03K 19/17748 326/38 |
| 2012/0253762 | A1 | 10/2012 | Ergas et al. | |
| 2012/0266018 | A1 | 10/2012 | Tanaka | |
| 2013/0318240 | A1* | 11/2013 | Hebert | G06F 9/5038 709/226 |
| 2015/0113538 | A1 | 4/2015 | Giroux et al. | |
| 2015/0155876 | A1 | 6/2015 | Jayasena et al. | |
| 2016/0212065 | A1 | 7/2016 | To et al. | |
| 2016/0314025 | A1* | 10/2016 | McGarry | G06F 9/542 |
| 2016/0380635 | A1 | 12/2016 | Roberts | |
| 2017/0061055 | A1 | 3/2017 | Khan et al. | |
| 2018/0032657 | A1 | 2/2018 | Matsumura | |

OTHER PUBLICATIONS

Brown, Stephen, and Jonathan Rose. "Architecture of FPGAs and CPLDs: A tutorial." IEEE Design and Test of Computers 13.2 (1996): 42-57.

Campi F et al: "A VLIW processor with reconfigurable instruction set for embedded applications", IEEE Journal of Solid-State Circuits, IEEE Service Center, Piscataway, NJ, USA, vol. 38, No. 11, Nov. 1, 2003 (Nov. 1, 2003), pp. 1876-1886, XP011102775, ISSN: 0018-9200, 001: 10. 1109/JSSC.2003.818292 figures 2-5 figure 8 p. 1878, right-hand column, 1ine 7-1ine 20 p. 1880, left-hand column, 1ine 25-1ine 37.

International Search Report, Application No. PCT/US2016/032504 dated Sep. 1, 2016.

Rose, Jonathan, Abbas El Gamal, and Alberto Sangiovanni-Vincentelli. "Architecture of field-programmable gate arrays." Proceedings of the IEEE 81.7 (1993): 1013-1029.

Tapp, Stephanie. "Bpi fast configuration and impact flash programming with 7 series fpgas." (Feb. 9, 2015). Xilinx, Inc.

Georgsen, Sindre, Hardware Context Switching on FPGAs, Jan. 1, 2014 (Jan. 1, 2014), XP055545223, Retrieved from the Internet: URL:https://pdfs.semanticscholar.org/4a4a/f3d8f3fb98c181dc2339375ef0342fcd24e1.pdf; Section 2.5.2.1; p. 5-p. 14.

International Search Report and Written Opinion of the International Searching Authority, Application No. PCT/US2018/042172 dated Oct. 23, 2018.

International Search Report and Written Opinion of the International Searching Authority, Application No. PCT/US2018/051373 dated Jan. 31, 2019.

Marescaux, T., Nollet, V., Mignolet, J. Y., Bartic, A., Moffat, W., Avasare, P., ... & Lauwereins, R. (2004). Run-time support for heterogeneous multitasking on reconfigurable SoCs. Integration, the VLSI journal, 38(1), 107-130.

Rana, V., Santambrogio, M., Sciuto, D., Kettelhoit, B., Koester, M., Porrmann, M., & Ruckert, U. (Mar. 2007). Partial dynamic reconfiguration in a multi-fpga clustered architecture based on linux. In 2007 IEEE International Parallel and Distributed Processing Symposium (p. 173). IEEE.

Santambrogio, M. D., Cancare, F., Cattaneo, R., Bhandariy, S., & Sciuto, D. (May 2012). An Enhanced Relocation Manager to Speedup Core Allocation in FPGA-based Reconfigurable Systems. In Parallel and Distributed Processing Symposium Workshops & PhD Forum (IPDPSW), 2012 IEEE 26th International (pp. 336-343). IEEE.

* cited by examiner

DYNAMIC VIRTUALIZED FIELD-PROGRAMMABLE GATE ARRAY RESOURCE CONTROL FOR PERFORMANCE AND RELIABILITY

GOVERNMENT RIGHTS

This invention was made with Government support under PathForward Project with Lawrence Livermore National Security (Prime Contract No. DE-AC52-07NA27344, Subcontract No. B620717) awarded by DOE. The Government has certain rights in this invention.

CROSS-REFERENCE TO RELATED APPLICATIONS

This application is related to co-pending U.S. patent application Ser. No. 15/812,411 entitled "Virtual FPGA Management and Optimization System", filed on Nov. 14, 2017, which is incorporated by reference in its entirety.

BACKGROUND

A field-programmable gate array (FPGA) is an integrated circuit device that is designed to be configured by an end user after manufacturing. In general, an FPGA includes an array of uncommitted circuit elements, called logic blocks, that are connected together by interconnect resources making up a programmable interconnect fabric. The interconnect resources may include, for example, logic gates that can be inter-wired in different configurations. The logic blocks in the FPGA can be configured to perform complex combinational functions, or logic functions such as AND or XOR. Logic blocks in an FPGA can also include memory elements, which may be implemented as simple flip-flops or more complete blocks of memory.

In an FPGA, the logic blocks can include elements such as lookup tables (LUTs) and other fixed functions that are programmed by inserting values into small Static Random Access Memories (SRAMs) or registers. The programming must be performed before the logic blocks can be used. After programming, each combination of function inputs to an LUT results in a predefined output, allowing implementation of any logic function. A typical FPGA relies on an external memory device and a single, relatively slow serial programming port for configuration. The FPGA typically has a "configuration mode" and a separate "user mode" where the entire chip is either in an idle state waiting to be programmed, or the programmed chip is running.

BRIEF DESCRIPTION OF THE DRAWINGS

The present disclosure is illustrated by way of example, and not by way of limitation, in the figures of the accompanying drawings.

DETAILED DESCRIPTION

The following description sets forth numerous specific details such as examples of specific systems, components, methods, and so forth, in order to provide a good understanding of the embodiments. It will be apparent to one skilled in the art, however, that at least some embodiments may be practiced without these specific details. In other instances, well-known components or methods are not described in detail or are presented in a simple block diagram format in order to avoid unnecessarily obscuring the embodiments. Thus, the specific details set forth are merely exemplary. Particular implementations may vary from these exemplary details and still be contemplated to be within the scope of the embodiments.

One embodiment of a datacenter includes pools of programmable logic devices such as Field-Programmable Gate Array (FPGA) devices that can be flexibly programmed for various purposes by users of the datacenter. These FPGA devices have the flexibility to change their functions completely or partially, and in real time. Virtualized pools of FPGA devices coexist with memory pools in the datacenter, and are distributed over many devices in a datacenter network, e.g., using an accelerator-friendly protocol such as Cache Coherent Interconnect for Accelerators (CCIX) or Generation Z (Gen-Z). The datacenter supports virtualization of its FPGA devices by organizing FPGA hardware resources into logical units called macro components, such that accelerator designs can be specified as macro graphs defining connections between macro components. One or more FPGA macro schedulers for scheduling use of the macro components are integrated in the FPGA devices themselves and/or are operated as standalone units connected to the FPGA devices through a network or system interconnect. These macro schedulers receive accelerator designs from users, allocate FPGA resources (e.g., macro components) from the pool of available resources, and program the allocated FPGA resources to implement the user-defined accelerators.

In one embodiment, an FPGA device includes a number of different types of macro components, which represent hardware resources such as input/output (I/O) ports, configurable logic block (CLB) regions, hardened blocks, or other combinations of circuit components, which can be used for coarse-grained allocation, placement, and routing of FPGA hardware resources for implementing application-specified hardware accelerator functions. The macro component thus functions as the unit of logic placement for shared FPGA devices in the datacenter. Scheduling of macro components is much simpler (e.g. the first free macro component can be allocated for a request) than performing a full synthesis, place and route process on the FPGA on demand. Synthesis, place and route can be performed offline for macro blocks that include more complex pre-compiled circuits. Macro schedulers and macro components in FPGA devices are described in co-pending U.S. patent application Ser. No. 15/812,411 entitled "Virtual FPGA Management and Optimization System", which is incorporated by reference in its entirety.

In addition to implementing user-defined functions, FPGA resources in the datacenter are also programmable for performing a variety of system functions, such as data error checking and correction, caching, network functions, etc.

Demand for these different system functions fluctuates depending on network traffic volume, data error rate, cache miss rates, and/or other operating conditions. Accordingly, the datacenter includes one or more resource controller devices that respond to such increased demand by recruiting spare FPGA resources, which are not already being used for implementing user-defined functions, and programming the spare FPGA resources to meet the increased demand. However, the amount of spare FPGA resources available for meeting the system demands can be insufficient when utilization of the FPGA resources is high for the user-defined functions.

Accordingly, one embodiment of a resource controller responds to high demand for system functions by displacing lower priority or under-utilized user-defined functions and reallocating their FPGA resources for system functions (e.g., network acceleration and data reliability functions). In one embodiment, the resource controller monitors multiple system operating metrics (e.g., network traffic, data error rate, etc.). When a condition is met in which one or more of the operating metrics exceeds a threshold, the resource controller reallocates FPGA resources from user defined functions to a system function that opposes the change in the operating metric. The resource controller sends a notification indicating the change in allocation to a macro scheduler associated with the reallocated FPGA resources and/or the displaced user functions (e.g., the macro scheduler that programmed the user function and/or any macro schedulers that are tracking the availability of the FPGA resources). Contexts are saved for user functions that are displaced, and the displaced user functions are migrated to a different set of FPGA resources or restored at a later time.

By this mechanism, hardware resources and accelerator services in the network of virtualized FPGA devices are dynamically partitioned between system hardware and user accelerator hardware depending on factors such as demand for network operations, latency to components involved in communication, and network congestion. In one embodiment, FPGA resources are also used for reliability (e.g., by adding redundancy) and for address translation features in certain accelerator devices, such as the Gen-Z Memory Management Unit (ZMMU) in the Gen-Z standard. A resource controller thus allows FPGA resources such as macro components to be allocated efficiently between system or user functions to trade off user process acceleration performance with system and network performance.

Figure 1:
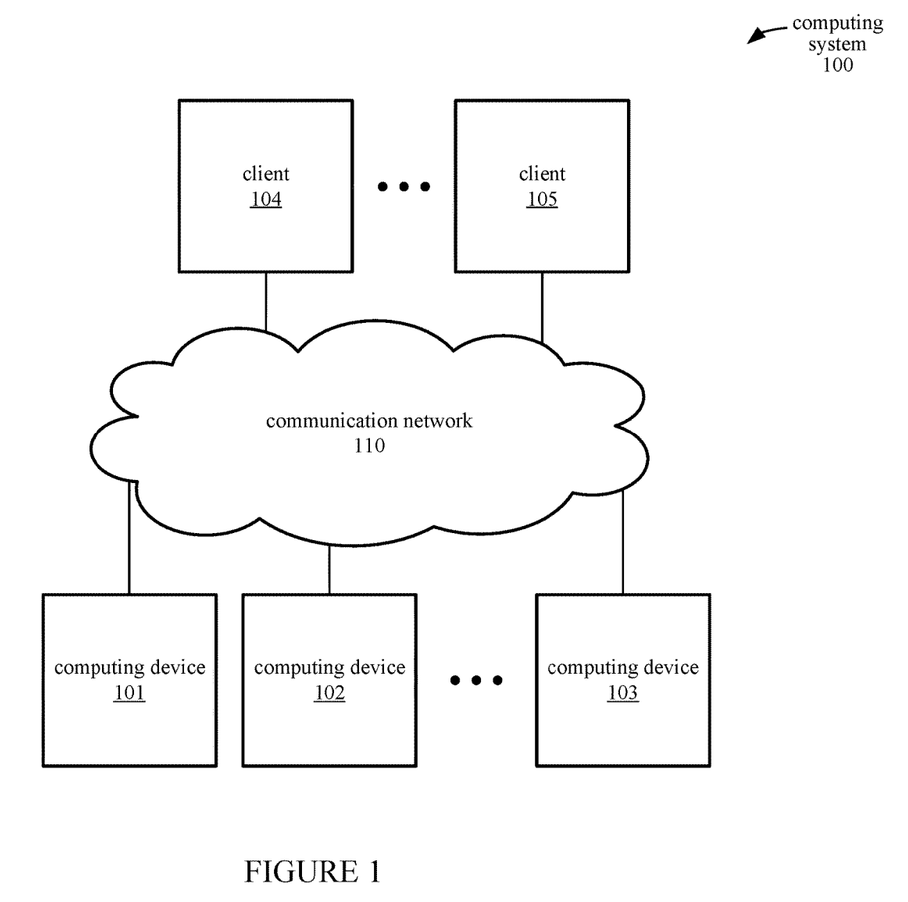
FIG. 1 illustrates an embodiment of a computing system that supports virtualization of hardware resources in a set of field programmable gate array (FPGA) devices.

FIG. 1 illustrates a computing system 100 that provides FPGA resources in multiple networked computing devices 101-103, according to an embodiment. In one embodiment, the computing system 100 represents a portion of a datacenter that provides computing resources to multiple client devices such as clients 104-105. Each of the computing devices 101-103 includes one or more FPGA devices, and the hardware resources (e.g., macro components) in the FPGA devices are made available for implementing functions defined by users of the system 100. Accelerator designs are provided by users via the client devices 104-105. In one embodiment, a user of the computing system 100 selects a design definition for each of the user defined functions to be implemented, and the selection is received at one of the client devices 104-105. The client devices 104-105 are embodied as any of various types of computing devices, such as a desktop personal computer, laptop, mobile device, etc. Design definitions are communicated from the receiving client devices 104-105 to one or more of the computing devices 101-103 via a communication network 110, which is a network capable of transmitting information between its nodes 101-105, such as a local area network (LAN), a wide area network (WAN), or another type of network or a combination of different types of networks.

Figure 2:
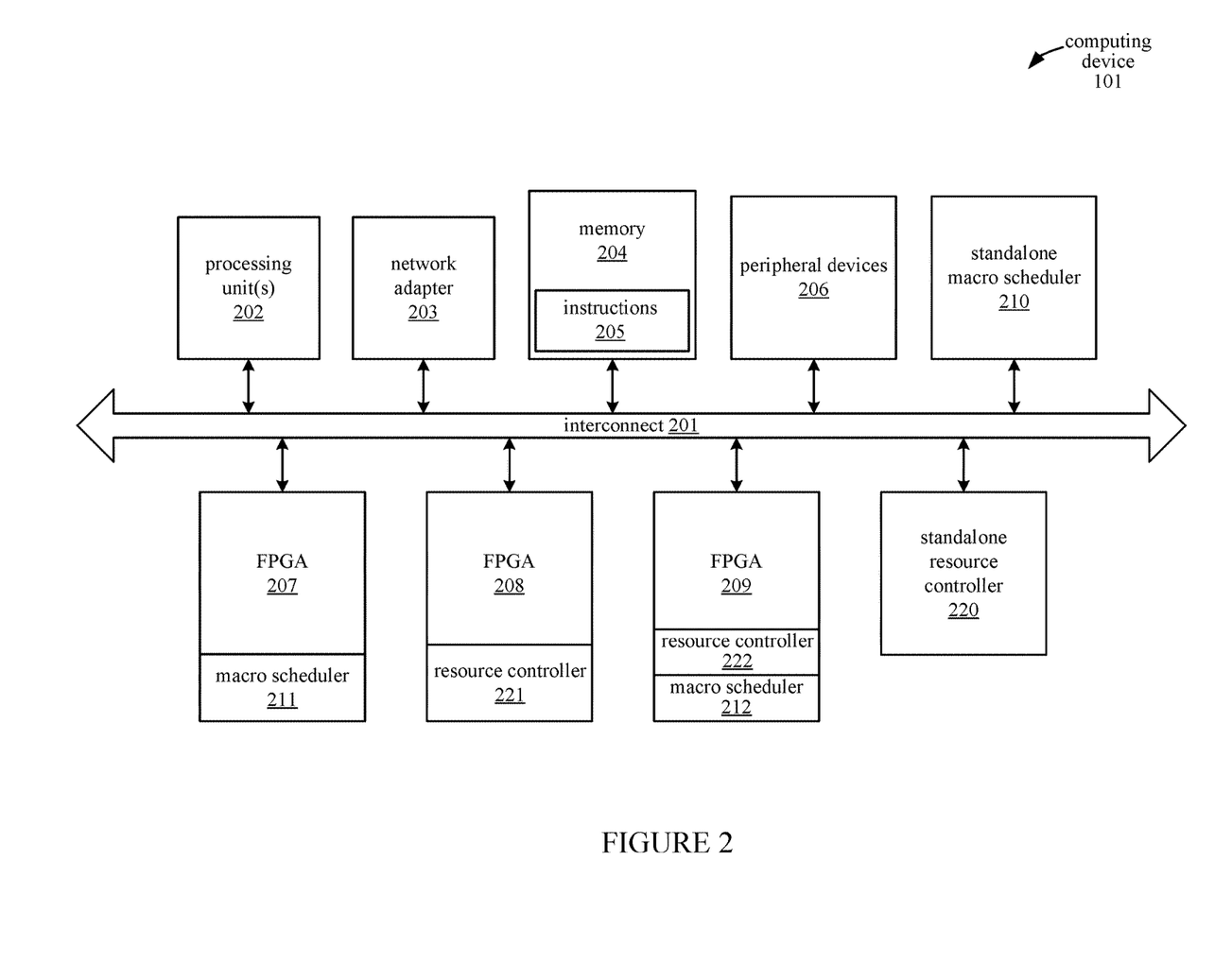
FIG. 2 illustrates components in computing device, according to an embodiment.

FIG. 2 illustrates an embodiment of a computing device 101 in the computing system 100. In general, the computing device 101 is embodied as any of a number of different types of devices, including but not limited to a laptop or desktop computer, mobile device, server, etc. In one embodiment, the computing device 101 is one of multiple blades in a server rack. The computing device 101 includes a number of components 202-220 that communicate with each other through an interconnect 201. In alternative embodiments, the interconnect 201 can be a bus, a network in which components 202-220 are connected via network switches, or another structure capable of conveying signals between devices. In computing device 101, each of the components 202-220 is capable of communicating with any of the other components 202-220 either directly through the bus 201, or via one or more of the other components 202-220. The components 201-220 in computing device 101 are contained within a single physical enclosure, such as a laptop or desktop chassis, server blade chassis, mobile device casing, etc. In alternative embodiments, some of the components of computing device 101 are embodied as peripheral devices such that the entire computing device 101 does not reside within a single physical enclosure.

Computing device 101 additionally includes a network adapter 203 that includes network interface circuitry for transmitting and receiving data over a wired or wireless network such as communication network 110. Computing device 101 also includes one or more peripheral devices 206. The peripheral devices 206 may include mass storage devices, location detection devices, sensors, input devices, or other types of devices used by the computing device 101.

Computing device 101 includes one or more processing units 202, which in the case of multiple processing units 202 are capable of operating in parallel. The processing unit(s) 202 receive and execute instructions 205 that are stored in the memory subsystem 204. In one embodiment, each of the processing unit(s) 202 includes multiple processing cores that reside on a common integrated circuit substrate. Memory subsystem 204 includes memory devices used by the computing device 101, such as random-access memory (RAM) modules, read-only memory (ROM) modules, hard disks, and other non-transitory computer-readable media.

Some embodiments of computing device 101 include fewer or more components than the embodiment as illustrated in FIG. 2. Other embodiments have more than one of a particular component; for example, an embodiment of computing device 101 could have multiple interconnects 201, network adapters 203, memory devices 204, etc.

The computing device 101 includes a set of field programmable gate array (FPGA) devices 207-209. In alternative embodiments, the computing device 101 includes fewer or more FPGA devices. The FPGAs 207-209 include uncommitted circuit elements called configurable logic blocks (CLBs) that can be connected by programmable interconnect elements. The CLBs in each FPGA include lookup tables and other fixed functions that can be configured by inserting values into specific static random access memory (SRAM) locations or registers in the FPGA. CLBs can thus be configured to perform arbitrary logic functions, as specified by a client device (e.g., one of the client devices 104-105).

Clients 104-105 are able to request configuration of the FPGAs 207-209 to implement user specified hardware accelerators, and can also define tasks to be executed in the hardware accelerators. The clients 104-105 provide design definitions, task definitions, and other information (e.g., configuration bitfiles) to an application programming interface (API) in a standalone macro scheduler 210, or in the local macro schedulers 211-212. The macro schedulers 210-212 allocate hardware resources of the FPGAs 207-209 and schedule task execution in response to the clients' requests. In one embodiment, access keys, encrypted communication, and/or other security measures are used to prevent malicious clients or processes from affecting other tasks.

In the computing system 100, macro schedulers 210-212 schedule tasks and allocate resources of the FPGA devices 207-209. Each of the macro schedulers receives from one or more of the client devices 104-105 a design definition indicating one or more specified macro components to be used for a design, and implements the design in one or more of the FPGA devices 207-209 by configuring the specified macro components according to the design definition. The macro schedulers 210-212 in the computing system 100 thus enable virtualization of FPGA accelerators implemented in the FPGA devices 207-209.

Computing system 100 includes both local macro schedulers 211-212 and a standalone macro scheduler 210. Alternative embodiments include fewer or more local macro schedulers and/or standalone macro schedulers. In the computing system 100, each of the FPGA devices 207 and 209 has a local macro scheduler 211 and 212, respectively, to place (i.e., physically map) and optimize concurrent accelerators to be implemented in the FPGA. The local macro schedulers 211-212 perform the functions described above with respect to the FPGA devices in which they reside; for example, macro schedulers 211 and 212 determine placement of allocated macro components in their own respective FPGA devices 207 and 209.

The standalone macro scheduler 210 is connected via the interconnect 201 to multiple FPGA devices 207-209 and can perform allocation, scheduling, and optimization functions for any of the connected FPGA devices 207-209. In one embodiment, the standalone macro scheduler 210 performs these functions for FPGA devices that do not have their own local macro schedulers. The standalone macro scheduler 210 receives function calls from the clients 104-105, and based on the function calls, allocates an appropriate portion of the macro components for implementing the requested user defined functions, and performs synthesis and place and route for designs received from the clients 104-105. The macro scheduler 210 also manages permissions and issues notifications to the clients.

The standalone macro scheduler 210 has access to requests from multiple clients (e.g., 104-105) and tracks the resources of multiple FPGA devices (e.g., 207-209), and can therefore identify a greater number of optimal placements and schedules. In addition, the standalone macro scheduler 210 operates in a separate location from the FPGA devices 207-209 and therefore can operate without being restricted by the thermal constraints of the FPGAs 207-209. Accordingly, the macro scheduler 210 can be a more powerful computer capable of synthesizing co-scheduled register transfer level (RTL) designs for faster and more compact implementations.

The computing system 100 includes both local resource controllers 221 and 222 and a standalone resource controller 220. Alternative embodiments include fewer or more local resource controllers and/or standalone resource controllers. In the computing system 100, each of the FPGA devices 208 and 209 has a local resource controller 221 and 222, respectively. While some FPGA devices include only a macro scheduler (e.g., FPGA 207) or a resource controller (e.g., FPGA 208), FPGA 209 includes both a resource controller 222 and a macro scheduler 212. In one embodiment, the functions of a resource controller are performed by executing instructions 205 in the processing unit 202; that is, the instructions 205 cause the processing unit 202 to perform the functions of a resource controller when executed by the processing unit 202.

Each of the resource controllers 220-222 monitors one or more operating metrics of the computing device 101 and responds to changes in the monitored operating metrics by allocating an additional portion of the FPGA resources for implementing a system function. A system function is implemented that corresponds to the operating metric in which the change is detected. In one embodiment, execution of the system function opposes the change in its corresponding operating metric. For example, if an increase in a data error rate operating metric is detected, accelerators for executing a data correction function are implemented in the allocated FPGA resources. Execution of the data correction function decreases (i.e., opposes the increase in) the data error rate.

When the available FPGA resources (i.e., that are not already allocated for user defined functions or other system functions) are not sufficient for implementing the system function, then the resource controller displaces a portion of the user defined functions or other system functions from the FPGA resources. The freed FPGA resources are then reallocated for the system function being expanded. In one embodiment, user functions that are designated as low priority or are infrequently used are displaced before higher priority or frequently used user functions.

The resource controllers 220-222 also generate notifications to inform the appropriate macro schedulers when FPGA resources have been reallocated. When macro components in an FPGA having a local macro scheduler (e.g., FPGAs 207 and 209) are reallocated, the resource controller notifies at least the local macro scheduler of the reallocation. Any other macro schedulers that are tracking the availability of the FPGA resources that were reallocated are also notified. For example, standalone macro scheduler 210 is able to allocate resources for implementing user functions in multiple FPGA devices 207-209 and is therefore notified if one of the resource controllers 220-222 reallocates macro components in one of these FPGAs 207-209. The resource controller generates a notification indicating which FPGA resources were reallocated and transmits the notification to the appropriate macro schedulers via the interconnect 201 and/or via a communication pathway within the FPGA when the macro scheduler is in the same FPGA device.

Local and standalone resource controllers are also able to communicate with each other via interconnect 201 and/or network 110 to cooperate and distribute functionality across multiple resource controllers. For example, the standalone resource controller 220 in one mode of operation responds to a change in an operating metric by requesting local resource controllers to allocate FPGA resources for the appropriate system function in their own respective FPGA devices.

Figure 3:
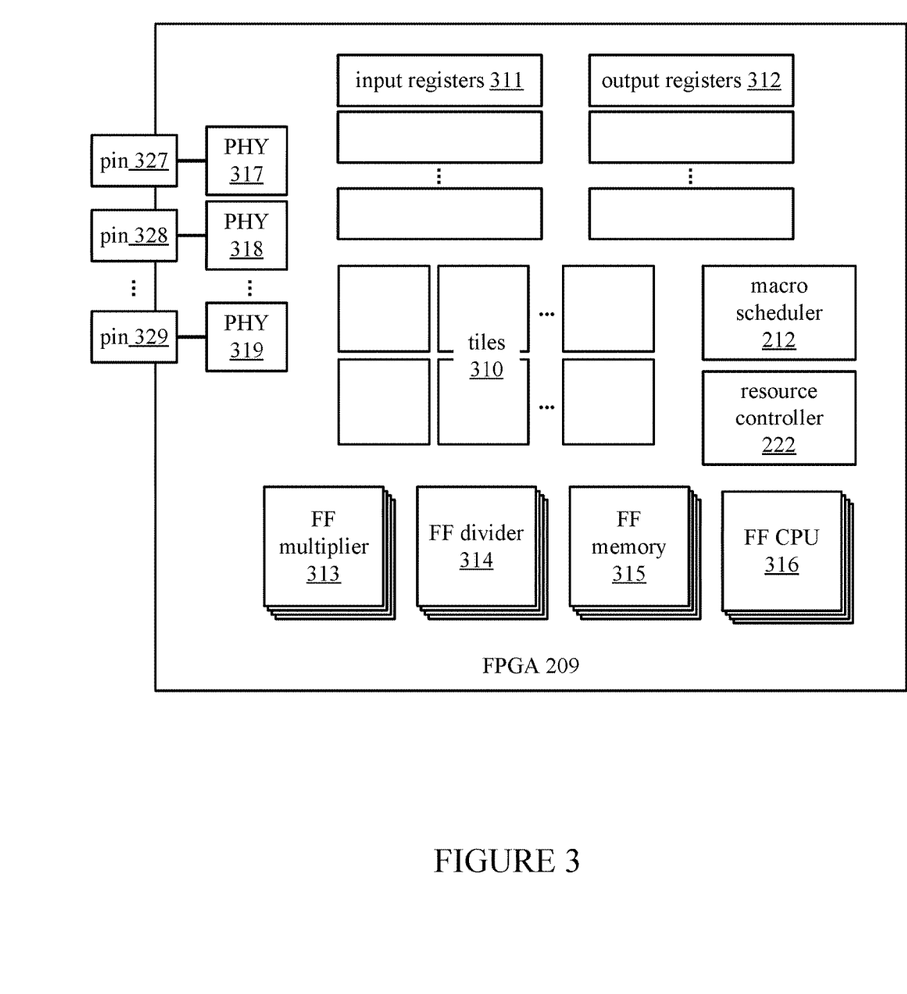
FIG. 3 illustrates hardware resources in an FPGA, according to an embodiment.

FIG. 3 illustrates an embodiment of an FPGA device 209 that includes hardware resources in the form of multiple macro components 310-319, and has both a local resource controller 222 and a local macro scheduler 212. A macro component includes a collection of smaller hardware components that are treated as a single unit for the purposes of allocation and scheduling. Some macro components are highly configurable, while others perform a single fixed function. The macro components 310-319 in the FPGA 209 include programmable tiles 310, input registers 311, output registers 312, fixed function blocks 313-316, and physical input/output (I/O) blocks 317-319.

Each of the tiles 310 is a programming region that includes CLBs, switches, fixed function blocks, and interconnects that can be programmed independently from other tiles. A tile can be associated with a bitfile, which is a file containing a synthesized, placed and routed design for the tile. Depending on the size or complexity of a function, a local macro scheduler 212 or standalone macro scheduler 210 is able to allocate multiple physical tiles to implement the function.

The FPGA 209 also includes a set of input registers 311 and output registers 312. The input registers 311 provide input data to a function that is implemented in the FPGA 209, while output registers 312 provide the resulting output data from the function. In one embodiment, the input registers 311 and output registers 312 are implemented as queues (e.g., first-in-first-out (FIFO) buffers) for higher performance. The FPGA 209 can be configured so that the input registers 311 and output registers 312 are connected to external pins of the FPGA (e.g., pins 327-329) via physical input/output (I/O) blocks (e.g., PHY blocks 317-319) and thus made accessible to external devices and processes. The PHY blocks 317-319 provide access to I/O resources such as transceivers, and are connected to the pins 327-329 of the FPGA.

The FPGA 209 also includes different types of fixed function (FF) blocks 313-316. FF block 313 is a multiplier block, FF block 314 is a divider block, FF block 315 is a memory block, and FF block 316 is a central processing unit block. The FPGA 209 can include multiple instances of each type of fixed function block. Alternative embodiments of FPGA 209 can include other types of FF blocks that perform different functions.

Figure 4:
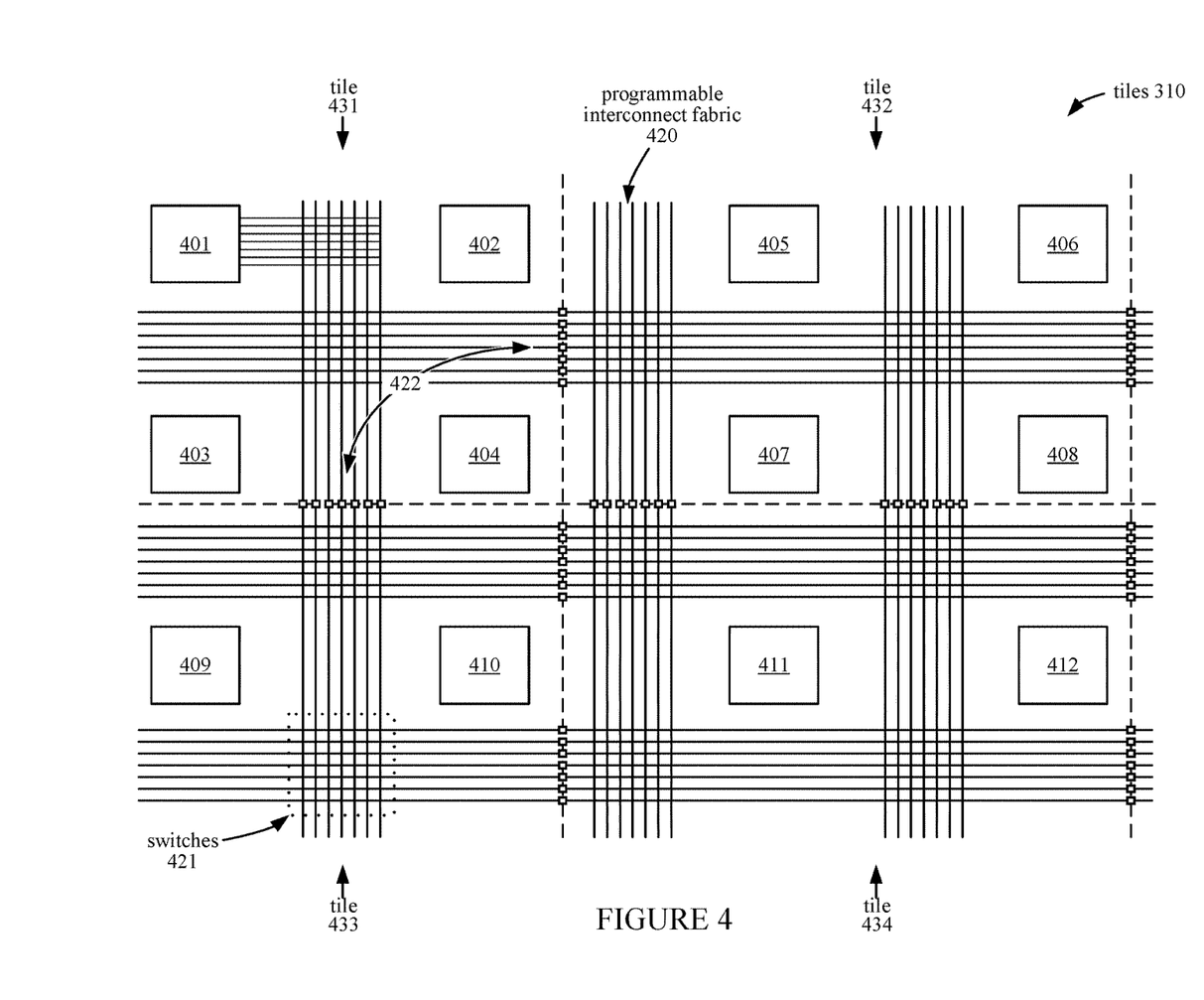
FIG. 4 illustrates programmable tiles in an FPGA, according to an embodiment.

FIG. 4 illustrates internal components of the tiles 310 in the FPGA 209, according to an embodiment. The tiles 310 are programming regions that include an array of configurable logic blocks (i.e., blocks 401-412) and interconnect resources 420-422 used to selectively connect the logic blocks 401-412.

In the FPGA 209, the boundaries of tiles 310 are indicated by the dashed lines. Tile 431 includes logic blocks 401-404, tile 432 includes logic blocks 405-408, tile 433 includes logic blocks 409 and 410, and tile 434 includes logic blocks 411 and 412. The tiles 431-434 divide the programmable logic contained in the FPGA 209 into separate configuration domains, which can be operated and programmed independently of each other, or combined to operate as larger programmable regions. Reconfiguration of the hardware in one tile can take place while a different tile is being used to perform logic functions.

As illustrated in FIG. 4, the tiles 431 and 432 each include four configurable logic blocks, while the tiles 433 and 434 each include two configurable logic blocks. Thus, a given tile need not have the same number of configurable logic blocks as another tile in the same programmable device. In alternative embodiments, tiles may include fewer or more than the illustrated number of configurable logic blocks.

Each of the configurable logic blocks 401-412 includes lookup tables (LUTs) and fixed function blocks. After programming, each combination of function inputs to an LUT results in a predefined output, allowing for the implementation of arbitrary logic functions. Each of the configurable logic blocks can be programmed to perform various functions by writing appropriate values into the LUTs and into configuration memory regions or registers that control the connections between the components (e.g., LUTs, fixed function blocks, etc.) in the logic block.

The configurable logic blocks 401-412 are each connected to a programmable interconnect fabric 420, which includes conductive traces and switches that allow the blocks 401-412 to be selectively connected to each other. In FIG. 4, conductive traces are illustrated connecting the configurable logic 401 to the programmable interconnect fabric 420. The other blocks 402-412 are also connected to the interconnect fabric 420 via conductive traces; however, the conductive traces connecting these blocks 402-412 to the interconnect fabric 420 are omitted from the illustration for the sake of clarity.

The programmable interconnect fabric 420 may in alternative embodiments be less uniform than illustrated in FIG. 4. For example, the interconnect fabric may include conductive traces that have different lengths or may have different numbers of parallel conductive traces in different regions of the FPGA 209. The conductive traces of the interconnect fabric 420 are connected to each other by switches where they intersect. For example, region 421 (indicated by the dotted lines) where multiple traces intersect includes a switch between each intersection between two conductive traces. Alternatively, switches may be present at only some of the intersections in region 421.

The programmable interconnect fabric also includes boundary switches, such as switches 422, that can be used to selectively isolate the components in one tile from the other tiles. The boundary switches are located at the boundaries of the tiles 431-434 in the FPGA 209. For example, the boundary switches 422 are located where the conductive traces of the programmable interconnect fabric 420 cross the boundary of the tile 431.

Accordingly, the boundary switches 422 can be used to disconnect the configurable logic blocks 401-404 and other components of the tile 431 from the other tiles 432-434. Additionally, boundary switches can be selectively closed or opened in order to combine tiles. For example, the boundary switches 422 that are between tiles 431 and 432 can be closed to combine tiles 431 and 432 with each other while the other boundary switches remain open to isolate the combined tile 431 and 432 from the other tiles 433 and 434.

Figure 5:
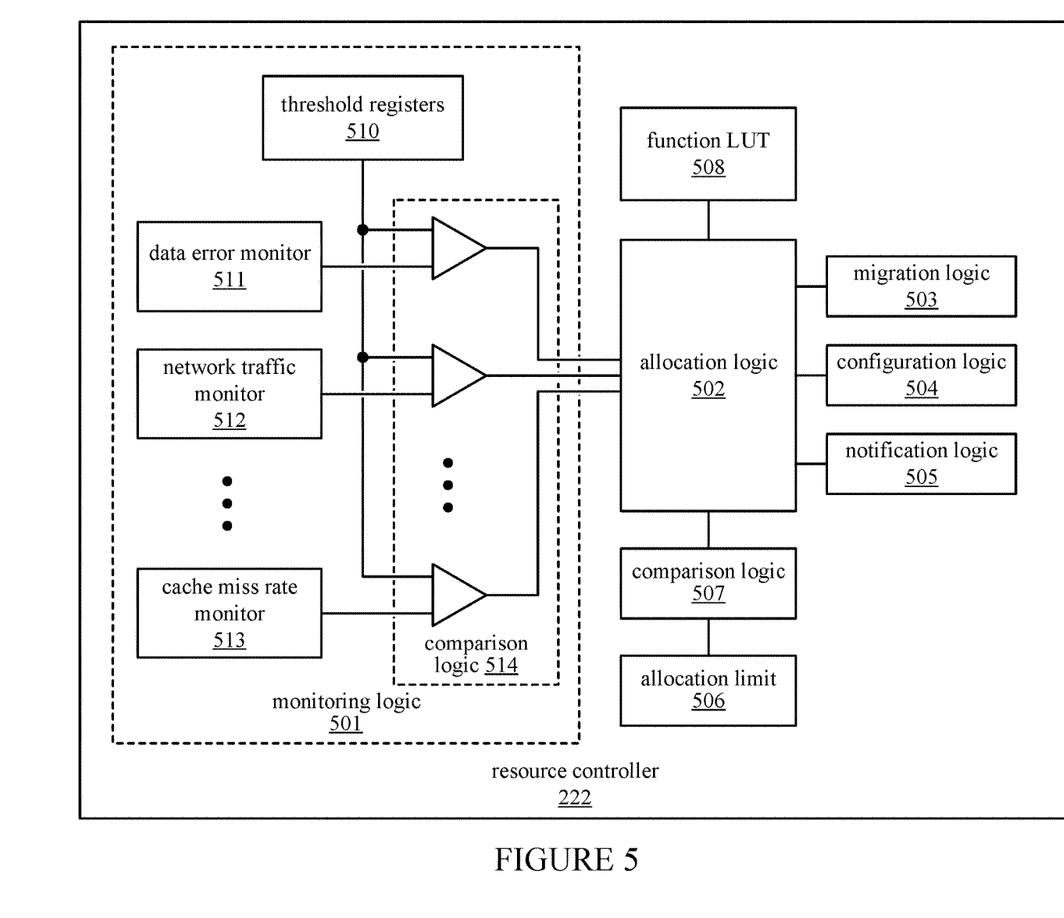
FIG. 5 illustrates an embodiment of a resource controller.

FIG. 5 is a block diagram illustrating circuit modules in a resource controller 222, according to an embodiment. The resource controller 222 represents the local resource controller in an FPGA device 209. A standalone resource controller such as controller 220 includes similar modules having similar functionality as the local resource controller 222.

The resource controller 222 dynamically trades off FPGA resource usage between user application acceleration and system functions such as network function acceleration, reliability functions, etc. In response to a change in an operating metric, the resource controller 222 deallocates FPGA resources from user defined functions and reallocates the FPGA resources to a system function related to the operating metric. The resource controller 222 is also capable of reallocating FPGA resources from lower priority system functions to implement higher priority system functions. In one embodiment, the controller 222 dynamically reallocates FPGA resources between these different functions in real time while the user defined functions are being executed in the FPGA device. Each time the resource controller 222 reallocates a portion of the FPGA resources, the resource controller 222 sends a notification to any macro schedulers that are tracking the reallocated FPGA resources that the FPGA resources have been reallocated and are unavailable for use in user accelerator designs.

The resource controller 222 includes monitoring logic 501 that monitors multiple operating metrics for the computing device 101 in which the resource controller 222 resides, or for other computing devices in the computing system 100. Accordingly, operating metrics are read or received from the same FPGA 209 in which the resource controller 222 resides, from different FPGA devices (e.g., 207 and 208) or other devices (e.g., memory 204, network adapter 203, etc.) in the same computing device 101, or from different computing devices in the computing system 100.

The monitoring logic 501 includes multiple monitors 511-513, each of which tracks one or more operating metrics for one or more computing devices 101-103 in the computing system 100. Accordingly, each of the monitors 511-513 is connected to and communicates with the computing device or devices it monitors. In one embodiment, each of the monitors 511-513 polls its monitored computing devices to periodically obtain updates for its respective operating metrics. Alternatively, the monitored computing devices write updates for the operating metrics to the monitors 511-513. Updates are read or received via the interconnect 201 and/or the communication network 110. The set of monitors 511-513 includes an arbitrary number of monitors, each of which tracks an arbitrary number of operating metrics.

The data error monitor 511 tracks data error rates for data processed in one of more of the computing devices 101-103. In one embodiment, the data error rate is measured as a bit error rate (the number of bit errors per unit time) or a bit error ratio (a ratio of bit errors per total bits processed) observed in network packets going to and from the FPGA 209, and/or in memories within the FPGA 209 itself. In alternative embodiments, the error rate can be observed from other FPGA devices in the computing device 101 or other computing devices in the system 100. The network traffic monitor 512 tracks network traffic metrics (e.g., incoming or outgoing traffic volume, latency, number of dropped packets, etc.) observed at one or more of the computing devices 101-103. The cache miss rate monitor 513 tracks cache miss rates for a cache (e.g., a translation lookaside buffer, TLB) implemented in the FPGA 209. One example of a TLB is for a page table in a Gen-Z Memory Management Unit (ZMMU) (or for a CPU on the FPGA 209) that provides address translation and security features outside of the processing unit 202 for remote memory requests (within an attached FPGA accelerator, for example). Other types of operating metrics that are monitored in the monitoring logic 501 measure the present performance (e.g., response time, latency, error rate), operating conditions (e.g., user demand, temperature), available resources (free memory or disk storage capacity, spare CPU bandwidth, power reserves, thermal budget), etc. of the computing devices in the computing system 100.

Monitoring logic 501 includes registers 510 for storing a threshold for each of the operating metrics being tracked by the monitors 511-513. The threshold registers provide the thresholds to comparison logic 514 in the monitoring logic 501. The comparison logic 514 periodically compares each of the operating metrics provided by the monitors 511-513 to their corresponding thresholds. When an operating metric exceeds its threshold, the comparison logic 514 detects the change and indicates to the allocation logic 502 that the threshold has been exceeded. The monitoring logic 501 thus monitors the multiple operating metrics and indicates to the allocation logic 502 when any of the operating metrics has exceeded its threshold.

The allocation logic 502 responds to an indication that an operating metric has exceeded its threshold by allocating additional FPGA resources for implementing a system function that addresses the change in the operating metric. In one embodiment, the allocation logic 502 identifies a system function associated with the operating metric by referencing a function lookup table 508. The function lookup table (LUT) 508 associates each operating metric threshold with at least one system function, where execution of the system function opposes the change detected in the operating metric. In one embodiment, the LUT 508 enumerates a number of different conditions (each defined by a relationship between one of the operating metrics and a threshold for the operating metric), and associates the allocation or deallocation of a system function with each of the enumerated conditions.

For example, if the condition that an operating metric is greater than its threshold is associated in the LUT 508 with allocation of FPGA resources for a particular system function, then an increase in the operating metric above the threshold triggers the allocation logic 502 to allocate the FPGA resources for the specified system function. When executed, the system function tends to decrease the operating metric, thus opposing the detected change which triggered the allocation. After the FPGA resources are allocated for the system function, the monitoring logic 501 continues to monitor the operating metric. In response to detecting a second change that opposes the first change (i.e., a second condition is met by the operating metric decreasing below the original threshold or a different threshold), the allocation logic 502 deallocates FPGA resources from the system function. In some cases, the second change is caused by execution of the system function in the additionally allocated FPGA resources. The deallocated FPGA resources are thus made available for allocation to other system functions or for user defined functions.

Depending on the configuration of LUT 508, allocation of FPGA resources for a function can be caused by an operating metric becoming greater than a threshold, or less than a threshold. Similarly, deallocation of FPGA resources can also be caused by an operating metric becoming either greater than or less than a threshold. Alternative embodiments exclude the LUT 508 and instead rely on other mechanisms (e.g., hard-coding, etc.) for determining which functions to allocate or deallocate in response to different conditions.

The FPGA resources in the computing system 100 are programmable for implementing a variety of different system functions for responding to changes in the monitored operating metrics, such as data repair and redundancy logic (e.g., error correction code (ECC) bits, ECC logic, spare replacement bits), network function accelerators (e.g., packet buffers, address translation tables, adjustable-size queues, control logic), caching functions (e.g., TLBs and page tables), etc.

In response to an increase in data error rates and/or other operating metrics tracked by the data error monitor 511, the allocation logic 502 allocates additional FPGA resources for error correction system functions such as ECC check bit storage and ECC engine logic. For example, an increase in the data error rate beyond a threshold causes additional FPGA resources to be allocated for implementing features such as triple logical redundancy, timing error detection (e.g., a delay detector), additional check bits, additional logic registers, memory ECC, etc. The allocation logic 502 also deallocates FPGA resources from error correction system functions when the data error rate decreases below another threshold, or when associated memory blocks in the computing devices are disabled (e.g., due to excessive failures) or replaced.

In response to network operating metrics tracked by the network traffic monitor 512, the allocation logic 502 allocates additional FPGA resources for network system functions. For example, the allocation logic 502 allocates additional FPGA resources for use as network packet buffers when the occupancy rate of existing buffers is consistently higher than a threshold rate for a set period of time. Additional FPGA resources are also allocated for servicing virtual channels, address translation tables, etc. when demand for these network functions increases due to increased network traffic. When demand for the network system functions decreases (e.g., buffer occupancy decreases below a threshold, fewer virtual channels are requested, network traffic decreases, etc.), the allocation logic 502 deallocates FPGA resources from performing the associated network system functions. Another example of a network function is an engine that can execute program code (programmable accelerator). More engines can be added for more concurrent functions in response to, for example, exceeding of a threshold by a number of queued function requests indicated by the host processor.

In response to operating metrics tracked by the cache miss rate monitor 513, the allocation logic 502 allocates additional FPGA resources for cache related functions. For example, when the monitoring logic 501 detects a high TLB miss rate or detects that processes are running out of memory (e.g., because page table granularity is too coarse), the allocation logic 502 allocates additional FPGA resources for increasing the size of page tables, implementing a larger TLB, and/or performing other cache-related functions. The allocation logic 502 decreases the allocation when the miss rate or the number of running processes decreases below their respective thresholds, or other conditions occur that indicate a decreased demand for cache functionality.

In one embodiment, the resource controller sets an allocation limit for each system function to prevent system functions from consuming too many of the available FPGA resources under certain conditions (e.g., when executing the system function fails to control the operating metric). The allocation limit 506 is stored in a register or other memory accessible to the allocation logic 502, and represents a maximum amount of FPGA resources that can be used for implementing the system function at one time. In one embodiment, the allocation limit 506 is recorded as a maximum number of tiles, fixed function blocks, registers, and/or other macro components that can be used for implementing the system function. In various embodiments, allocation limits apply separately to specific types or classes of macro components, or for all types of macro components.

In one embodiment, the comparison logic 507 determines whether a total number of macro components that will be allocated for the system function is less than the allocation limit 506. The total number of macro components is calculated as a sum of the number of macro components to be allocated and the number of macro components previously allocated for the same system function. In one embodiment, the comparison logic 507 determines the minimum allocation for the system function as the number of FPGA resources (e.g., number of macro components) used to make the smallest functional unit of the system function, then compares the minimum allocation value with the remaining allocation quota. The remaining allocation quota is calculated by subtracting the amount of FPGA resources already allocated to the system function from the allocation limit 506 for the system function. The remaining allocation quota represents a maximum amount of additional FPGA resources that can be allocated for the system function without exceeding the allocation limit 506. If the minimum allocation for the system function exceeds the remaining allocation quota, then the allocation limit 506 for the function has been effectively reached, and no additional FPGA resources are allocated for the system function.

If the allocation limit 506 has not been reached, the allocation logic 502 determines an amount of FPGA resources to allocate for the system function that is less than the remaining allocation quota for the function (i.e., does not result in the allocation limit 506 being exceeded). The allocation logic 502 determines the amount of FPGA resources to be allocated for the system function based on factors such as the minimum allocation for the system function, characteristics of the operating metric that exceeded its threshold (e.g., rate of change, magnitude, number of times the threshold was previously exceeded, amount by which the threshold was exceeded, etc.), and/or other operating metrics.

The allocation logic 502 identifies a portion of the FPGA resources to be allocated for the system function. In one embodiment, the allocation logic 502 in a local resource controller identifies FPGA resources for the allocation from the FPGA in which it resides. Alternatively, a local resource controller is also able to identify FPGA resources from other FPGA devices in the same computing device or in other computing devices. In one embodiment, the standalone resource controller 220 identifies FPGA resources in the same computing device 101 for the allocation. In alternative embodiments, the standalone resource controller 220 is also able to identify FPGA resources in other computing devices 102-103 in the computing system 100 for the allocation. In one embodiment, a change in an operating metric observed at one FPGA (i.e., the operating metric is generated based on processes executing on the FPGA) causes reallocation of resources in another FPGA, and a change in an operating metric observed at one computing device causes reallocation of FPGA resources in another computing device.

If available, unallocated FPGA resources are prioritized for including in the set of identified FPGA resources over FPGA resources that are already allocated for user functions or other system functions. However, when there are not enough unallocated FPGA resources for implementing the system function, then some or all of the identified FPGA resources are reallocated from user defined functions or from other system functions having lower priority. These previously allocated FPGA resources include macro components that were previously allocated to user-defined functions or other system functions that are executing at the time of the reallocation.

The allocation logic 502 invokes the migration logic 503 to migrate any user defined or system functions that are already executing in the FPGA resources that are to be reallocated for the new system function. The migration logic 503 performs context management operations to allow switching (e.g., bitstream swapping) from the existing configuration to the new configuration. A context save entails saving the register and memory state for the configured region (e.g., including a set of macro components previously configured for a user defined function). The saved state and configuration data for the user defined function is restored to resume execution of the original task in the same FPGA resources at a later time, or in a different set of FPGA resources in the same FPGA, in a different FPGA in the same computing device, or in a different computing device.

The allocation logic 502 allocates the region for the new system function, then invokes the configuration logic 504 to reconfigure the region for executing the system function. The configuration logic 504 programs the FPGA resources to implement the system function by writing configuration data (e.g., bitfiles or bitstreams) for the system function to the configuration memory and registers that control the connections between the FPGA resources. The configuration logic 504 initiates execution of the system function in the programmed FPGA resources. Execution of the system function causes a change in the operating metric that opposes the initial triggering change that caused the additional FPGA resources to be allocated for expanding the system function. For example, a data error rate increasing above a threshold causes additional FPGA resources to be allocated for error correction functions, which in turn reduces the data error rate.

The allocation logic 502 also invokes the notification logic 505, which generates a notification indicating that the FPGA resources were reallocated. The notification is transmitted to the macro scheduler that originally allocated the FPGA resources for the displaced user defined functions or system functions, and to any other macro schedulers that are tracking the availability of the FPGA resources. In alternative embodiments, some of the operations described above as being performed by the resource controller 222 (e.g., context saving and migration of the displaced functions, configuring the FPGA resources) are performed by a macro scheduler in response to the notification.

When the monitoring logic 501 detects a condition (e.g., the operating metric decreases below the threshold) that is associated with the deallocation of the FPGA resources from the system function, the allocation logic 502 deallocates some or all of the additional FPGA resources that were previously allocated for expanding the system function. The notification logic 505 generates a notification indicating the deallocation of the FPGA resources. The FPGA resources are reallocated to the previously displaced user defined functions or system functions, which are restored to the FPGA resources from the saved context. Alternatively, the FPGA resources are deallocated and made available to one or more macro schedulers for allocating user functions according to the normal process.

Figure 6:
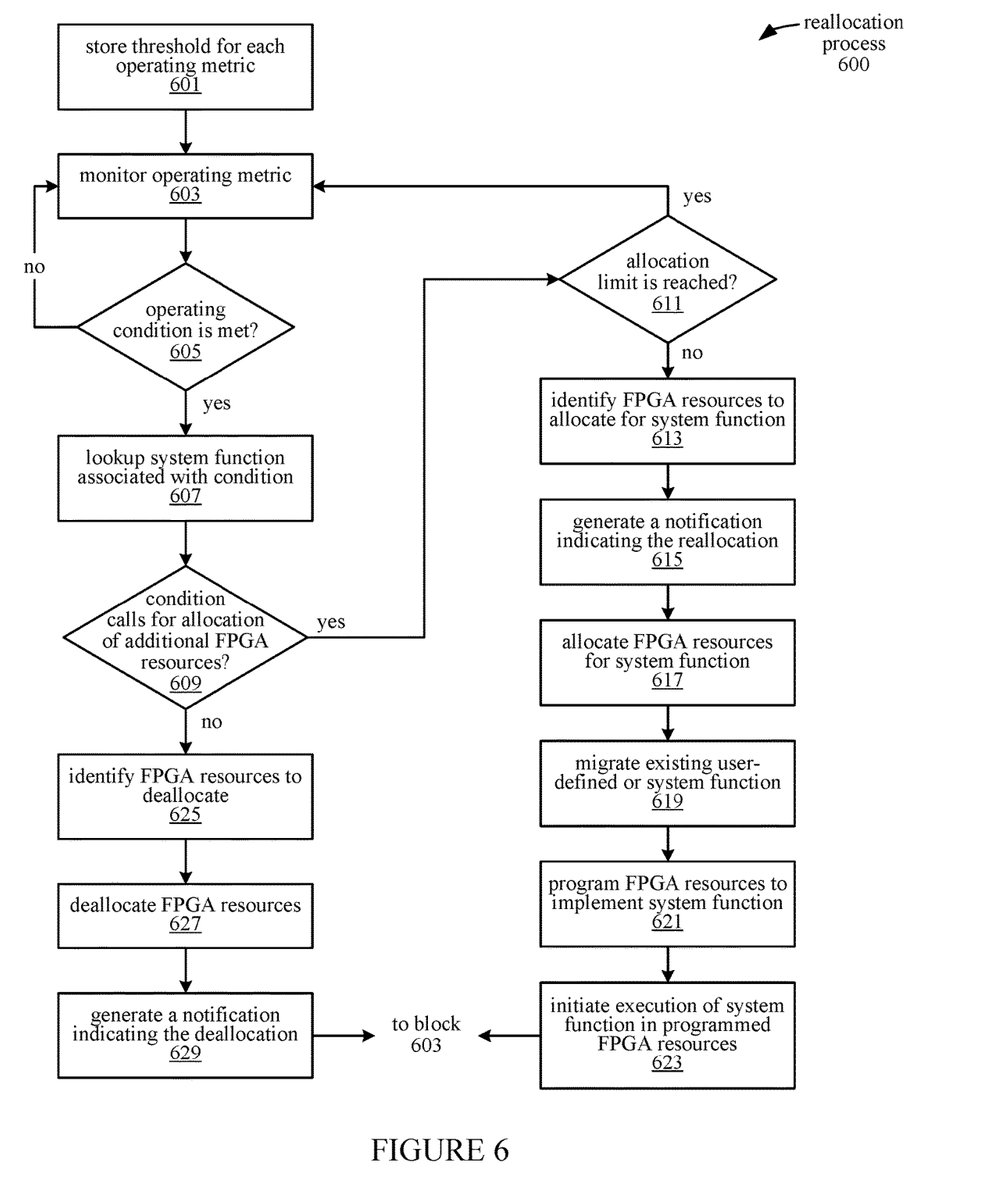
FIG. 6 is a flow diagram illustrating a process for reallocating FPGA hardware resources in response to changes in operating metrics, according to an embodiment.

FIG. 6 is a flow diagram illustrating a process 600 for reallocating FPGA resources to perform system functions in response to corresponding changes in operating metrics, according to an embodiment. The operations of process 600 are performed by the components of the computing system 100, such as the resource controller 222.

At block 601, the threshold registers 510 in the resource controller 222 store one or more thresholds for each operating metric in a set of operating metrics. Each of the operating metrics represents a measurable value that partially describes the operation of one or more of the computing devices 101-103 in the computing system 100. The operating metrics include a data error rate for data received and/or stored in the FPGA device 209, a network traffic volume representing an amount of network traffic processed by or observed at one or more of the computing devices 101-103, a cache miss rate for cache memories implemented in one or more of the computing devices 101-103, and/or other values that describe the operation of the computing devices 101-103.

At block 603, the monitoring logic 501 monitors the operating metrics for changes. Each of the operating metrics is tracked by one of the monitors 511-513 and, in comparison logic 514, is compared with its corresponding threshold stored in registers 510. A change in an operating metric is detected by the comparison logic 514 when the operating metric exceeds its threshold. Accordingly, a change in the monitored data error rate, network traffic volume, cache miss rate, or other operating metric is detected when each of these metrics exceeds one of its respective thresholds. The allocation logic 502 receives signals from the monitoring logic 501 indicating which thresholds have been exceeded.

A function LUT 508 enumerates a number of operating conditions, where each operating condition represents a relationship between an operating metric and its threshold (e.g., the data error rate is greater than its threshold), or a combination of multiple such relationships (e.g., data error rate and network traffic volume have both exceeded their respective thresholds). At block 605, when no operating conditions are met (i.e., none of the operating conditions is evaluated as true), the process 600 returns to block 603. At block 603, the monitoring logic 501 continues monitoring the operating metrics.

At block 605, if one of the operating conditions is met, the allocation logic 502 checks the function LUT 508 to identify a system function that is associated with the operating condition. For example, if the condition is met where a data error operating metric is greater than its threshold, the allocation logic 502 checks the LUT 508 and identifies a data error correction function that is associated with this condition. At block 609, if the condition is associated with an allocation of additional FPGA resources (rather than a deallocation), then the process 600 continues at block 611.

At block 611, the allocation logic 502 determines whether the allocation limit 506 for the identified function will be reached if additional FPGA resources are allocated for the function. The allocation logic 502 determines a minimum allocation for the function as the amount of FPGA resources for implementing the smallest functional unit of the system function, and compares this amount to the remaining allocation quota for the function. The remaining allocation quota is calculated as the difference between the amount of FPGA resources already allocated to the system function and the allocation limit 506 for the function. If the minimum allocation is greater than the remaining allocation quota for the function, then the allocation limit 506 is effectively reached (i.e., allocation of any more FPGA resources for the system function will cause the allocation limit 506 to be exceeded) and no additional FPGA resources are allocated for the system function. The process 600 returns to block 611, and the monitoring logic 501 continues monitoring the operating metrics.

At block 611, if the allocation limit 506 is not effectively reached, then the process 600 continues at block 613. At block 613, the allocation logic 502 determines an amount of FPGA resources to allocate for the system function that is less than the remaining allocation quota and will not result in the allocation limit 506 being exceeded. The allocation logic 502 also identifies a specific portion of the available FPGA resources (e.g., macro components) for allocating to the system function. In one embodiment, the allocation logic 502 selects FPGA resources nearest to the device or devices in which the triggering change in the operating metric was observed. Alternatively, the allocation logic 502 is capable of selecting FPGA resources residing in any of the computing devices 101-103 in the system 100 for allocation to the system function. In one embodiment, FPGA resources that are not allocated to any other user-defined or system functions are selected first; however, if not enough such FPGA resources are unallocated, FPGA resources that are already in use by user-defined functions or other system functions are selected for reallocation. The allocation logic 502 avoids displacing functions that are frequently used or are designated as critical or having a higher priority than the system function being expanded.

At block 615, the allocation logic 502 transmits information identifying the FPGA resources to be reallocated to the notification logic 505, which generates a notification identifying the reallocated FPGA resources. The notification logic 505 transmits the notification to any macro schedulers that had scheduled the functions that will be displaced from the FPGA resources, and to any other macro schedulers that are tracking the availability of the FPGA resources. At block 617, the allocation logic 502 allocates the selected FPGA resources for the system function.

At block 619, the allocation logic 502 invokes the migration logic 503 to save contexts for any user defined functions or system functions being displaced. Displaced functions are migrated to a different set of FPGA resources, or are restored in the same set of FPGA resources at a later time (e.g., after the triggering change in the operating metric has been reversed and the FPGA resources are no longer allocated for the system function).

At block 621, the allocation logic 502 invokes the configuration logic 504 to implement the system function by programming the selected FPGA resources, which include macro components in one or more FPGA devices. The configuration logic programs the macro components by writing data from a configuration bitstream or bitfile for the system function to the configuration memory and/or registers associated with the macro components. In one embodiment, the configuration logic 504 programs the selected FPGA resources to execute a system function that opposes the triggering change in the operating metric. For example, an increase in the data error rate causes the configuration logic to program the additional FPGA resources to perform an error correction function, which decreases the data error rate. An increase in a cache miss rate causes the configuration logic 504 to program the additional FPGA resources to extend the cache, thus decreasing the cache miss rate. In some cases, the system function does not necessarily oppose the triggering change in the operating metric, but addresses a condition indicated by the change. For example, an increase in network traffic causes the configuration logic 504 to program the additional FPGA resources to implement network function accelerators so that the increased network traffic is timely processed. After the configuration is complete, the configuration logic 504 initiates execution of the system function at block 623.

From block 623, the process 600 returns to block 603, where monitoring of the operating metrics continues in the monitoring logic 501. When the execution of the system function initiated at block 623 subsequently effects a change in one or more operating metrics, these subsequent changes are detected by the monitoring logic 501, in accord with blocks 603 and 605. In one embodiment, the monitoring logic detects a subsequent change in an operating metric that opposes a triggering change previously detected at block 605 of an earlier iteration of process 600. For example, if the reallocation of additional FPGA resources for a data error correction function was previously triggered by an increase in the data error rate above its threshold, then a subsequent decrease in the data error rate caused by execution of the data error correction function is detected by the monitoring logic 501 at block 605. Operating metrics can also change due to factors other than the execution of a previously expanded system function (e.g., network traffic decreasing as a result of decreased user activity).

The monitoring logic 501 responds to subsequent changes in one or more operating metrics by indicating the changes to the allocation logic 502 (e.g., as signals indicating whether each operating metric has exceeded its one or more thresholds). Based on the changes, the allocation logic 502 determines which conditions are met and looks up from the function LUT 508 a corresponding system function for which FPGA resources should be allocated or deallocated in response to each condition.

In one embodiment, opposing conditions are defined in the function LUT 508 so that when one condition causes allocation of additional FPGA resources for a system function, its opposing condition causes deallocation of FPGA resources for the same system function. Some conditions are detected based on the same operating metric and threshold as their opposing conditions, while others are detected based on a different threshold and/or operating metric. Continuing the prior example in which a data error correction function was previously triggered by an increase in the data error rate, a subsequent decrease in the data error rate is associated with deallocation of the FPGA resources from the data error correction function.

At block 609, if the detected condition is associated with the deallocation of FPGA resources from a system function, the process 600 continues at block 625. At block 625, the allocation logic 502 identifies the FPGA resources for deallocating, which are the resources allocated to the system function identified at block 607. At block 627, the allocation logic 502 deallocates the identified FPGA resources. At block 629, the allocation logic 502 invokes the notification logic 505 to generate a notification indicating that the FPGA resources have been deallocated and are available to be allocated to user defined functions or other system functions. The notification is communicated to any macro schedulers in the system 100 that are tracking the availability of the deallocated FPGA resources.

By the operation of process 600, FPGA resources in the computing system 100 are dynamically partitioned between user defined functions and system functions depending on demand indicated by the monitored operating metrics. Operating conditions indicating a higher demand for a system function causes additional FPGA resources to be allocated for the system function. The FPGA resources are deallocated when demand for the system function decreases so that the FPGA resources can be used for accelerating user defined functions.

A method for allocating FPGA resources includes monitoring a first operating metric for one or more computing devices, identifying a first portion of plurality of macro components of a set of one or more field programmable gate array (FPGA) devices in the one or more computing devices, where the first portion is allocated for implementing one or more user defined functions. The method also includes, in response to a first change in the first operating metric, reallocating the first portion of the macro components for implementing a system function associated with the first operating metric, and generating a first notification indicating the reallocation of the first portion.

In the method, the first operating metric is one of a plurality of operating metrics for the one or more computing devices. The method also includes, for each operating metric of the plurality of operating metrics, storing a threshold for the operating metric in a register, monitoring the operating metric by comparing the operating metric with the threshold, and detecting a change in the operating metric when the operating metric exceeds the threshold.

In the method, the reallocating is performed when a total number of macro components allocated for implementing the system function is less than an allocation limit. The total number of macro components includes the first portion of the plurality of macro components and a second portion of the macro components previously allocated for the system function.

In an embodiment of the method, the first operating metric represents a data error rate for data received at one or more of the FPGA devices, and the first change in the first operating metric results in the data error rate exceeding a threshold for the data error rate. The method also includes implementing the system function by programming the first portion of the macro components to perform error correction on the data.

In an embodiment of the method, the first operating metric represents a network traffic volume of network traffic processed by the one or more computing devices, and the first change in the first operating metric results in the network traffic volume exceeding a threshold for the network traffic volume. The method also includes implementing the system function by programming the first portion of the macro components to implement a network function accelerator.

In an embodiment of the method, the first operating metric represents a cache miss rate for a cache implemented in the one of the FPGA devices, and the first change in the first operating metric results in the cache miss rate exceeding a threshold for the cache miss rate. The method also includes implementing the system function by programming the first portion of the macro components to increase the capacity of the cache.

The method includes implementing the system function by programming the first portion of the macro components, and causing a second change in the operating metric by executing the system function, where the second change opposes the first change.

The method includes, prior to programming the first portion of the macro components, saving a context for the one or more user functions, and migrating the one or more user functions to a second portion of the plurality of macro components.

The method includes, in response to a second change in the first operating metric, deallocating the first portion of the macro components, where the second change opposes the first change, and generating a second notification indicating the deallocation of the first portion.

A controller device, includes monitoring logic for monitoring a first operating metric for one or more computing devices, allocation logic coupled with the monitoring logic for identifying a first portion of a plurality of macro components of a set of one or more field programmable gate array (FPGA) devices in one or more computing devices, where a first portion of the plurality of macro components is allocated for implementing one or more user defined functions. In response to a first change in the first operating metric, the allocation logic also reallocates the first portion of the macro components for implementing a system function associated with the first operating metric. The controller device also includes notification logic coupled with the allocation logic for generating a first notification indicating the reallocation of the first portion.

In the controller device, the first operating metric is one of a plurality of operating metrics for the one or more computing devices. In the controller device, for each operating metric of the plurality of operating metrics, the monitoring logic monitors the operating metric by comparing the operating metric with a threshold for the operating metric, and detecting a change in the operating metric when the operating metric exceeds the threshold. The controller device also includes a register for storing the threshold.

The controller device includes comparison logic for determining whether a total number of macro components allocated for implementing the system function is less than an allocation limit. The total number of macro components includes the first portion of the plurality of macro components and a second portion of the macro components previously allocated for the system function. The allocation logic performs the reallocating in response to the comparison logic determining that the total number of the macro components is less than the allocation limit.

The controller device includes migration logic coupled with the allocation logic for, prior to the reallocating of the first portion of the macro components, saving a context for the one or more user functions and migrating the one or more user functions to a second portion of the plurality of macro components. The allocation logic, after the reallocating and in response to a second change in the first operating metric, deallocates the first portion of the macro components, where the second change opposes the first change. The notification logic generates a second notification indicating the deallocation of the first portion.

The controller device includes configuration logic coupled with the allocation logic for implementing the system function by programming the first portion of the macro components, and causing a second change in the operating metric by initiating execution of the system function, where the second change opposes the first change.

In the controller device, the first operating metric represents one of a data error rate for data received at one or more of the FPGA devices, a network traffic volume processed by the one or more computing devices, and a cache miss rate for a cache implemented in an FPGA device.

In the controller device, for each operating metric of a plurality of operating metrics including the first operating metric, the monitoring logic stores a threshold corresponding to the operating metric, and compares the operating metric with the threshold. The first change in the first operating metric results in the first operating metric exceeding the threshold corresponding to the first operating metric.

A computing system includes a set of one or more field programmable gate array (FPGA) devices in one or more computing devices, a macro scheduler coupled with the set of FPGA devices for allocating a portion of a plurality of macro components in the set of FPGA devices for implementing one or more user defined functions, and a controller device coupled with the set of FPGA devices for monitoring a first operating metric for the one or more computing devices, in response to a first change in the first operating metric, reallocating the portion of the macro components for implementing a system function associated with the first operating metric, and generating a first notification indicating the reallocation of the portion.

In the computing system, the controller device resides on a first FPGA device in the set of FPGA devices.

In the computing system, the controller device transmits the first notification to the macro scheduler.

In the computing system, the macro scheduler receives from a client device a design definition indicating one or more specified macro components for a design, and implements the design in the set of FPGA devices by configuring the portion of the macro components according to the first design definition, where the portion includes the one or more specified macro components.

The computing system also includes one or more client devices for receiving a user selection of a design definition for each of the one or more user defined functions, and a communication network coupling the one or more client devices with the one or more computing devices.

As used herein, the term "coupled to" may mean coupled directly or indirectly through one or more intervening components. Any of the signals provided over various buses described herein may be time multiplexed with other signals and provided over one or more common buses. Additionally, the interconnection between circuit components or blocks may be shown as buses or as single signal lines. Each of the buses may alternatively be one or more single signal lines and each of the single signal lines may alternatively be buses.

Certain embodiments may be implemented as a computer program product that may include instructions stored on a non-transitory computer-readable medium. These instructions may be used to program a general-purpose or special-purpose processor to perform the described operations. A computer-readable medium includes any mechanism for storing or transmitting information in a form (e.g., software, processing application) readable by a machine (e.g., a computer). The non-transitory computer-readable storage medium may include, but is not limited to, magnetic storage medium (e.g., floppy diskette); optical storage medium (e.g., CD-ROM); magneto-optical storage medium; read-only memory (ROM); random-access memory (RAM); erasable programmable memory (e.g., EPROM and EEPROM); flash memory, or another type of medium suitable for storing electronic instructions.

Additionally, some embodiments may be practiced in distributed computing environments where the computer-readable medium is stored on and/or executed by more than one computer system. In addition, the information transferred between computer systems may either be pulled or pushed across the transmission medium connecting the computer systems.

Generally, a data structure representing the computing system 100 and/or portions thereof carried on the computer-readable storage medium may be a database or other data structure which can be read by a program and used, directly or indirectly, to fabricate the hardware including the computing system 100. For example, the data structure may be a behavioral-level description or register-transfer level (RTL) description of the hardware functionality in a high level design language (HDL) such as Verilog or VHDL. The description may be read by a synthesis tool which may synthesize the description to produce a netlist including a list of gates from a synthesis library. The netlist includes a set of gates which also represent the functionality of the hardware including the computing system 100. The netlist may then be placed and routed to produce a data set describing geometric shapes to be applied to masks. The masks may then be used in various semiconductor fabrication steps to produce a semiconductor circuit or circuits corresponding to the computing system 100. Alternatively, the database on the computer-readable storage medium may be the netlist (with or without the synthesis library) or the data set, as desired, or Graphic Data System (GDS) II data.

Although the operations of the method(s) herein are shown and described in a particular order, the order of the operations of each method may be altered so that certain operations may be performed in an inverse order or so that certain operation may be performed, at least in part, concurrently with other operations. In another embodiment, instructions or sub-operations of distinct operations may be in an intermittent and/or alternating manner.

In the foregoing specification, the embodiments have been described with reference to specific exemplary embodiments thereof. It will, however, be evident that various modifications and changes may be made thereto without departing from the broader scope of the embodiments as set forth in the appended claims. The specification and drawings are, accordingly, to be regarded in an illustrative sense rather than a restrictive sense.

What is claimed is:

1. A method, comprising:
monitoring a first operating metric for one or more computing devices;
identifying a first portion of a plurality of macro components of a set of one or more field programmable gate array (FPGA) devices in the one or more computing devices, wherein the first portion is allocated for implementing one or more user defined functions;
in response to a first change in the first operating metric, reallocating the first portion of the macro components for implementing a system function associated with the first operating metric; and
generating a first notification indicating the reallocation of the first portion.

2. The method of claim 1, wherein:
the first operating metric is one of a plurality of operating metrics for the one or more computing devices;
the method further comprises, for each operating metric of the plurality of operating metrics:
storing a threshold for the operating metric in a register, monitoring the operating metric by comparing the operating metric with the threshold, and detecting a change in the operating metric when the operating metric exceeds the threshold.

3. The method of claim 1, wherein:
the reallocating is performed when a total number of macro components allocated for implementing the system function is less than an allocation limit, wherein the total number of macro components includes the first portion of the plurality of macro components and a second portion of the macro components previously allocated for the system function.

4. The method of claim 1, wherein:
the first operating metric represents a data error rate for data received at one or more of the FPGA devices;
the first change in the first operating metric results in the data error rate exceeding a threshold for the data error rate; and
the method further comprises implementing the system function by programming the first portion of the macro components to perform error correction on the data.

5. The method of claim 1, wherein:
the first operating metric represents a network traffic volume of network traffic processed by the one or more computing devices;
the first change in the first operating metric results in the network traffic volume exceeding a threshold for the network traffic volume; and
the method further comprises implementing the system function by programming the first portion of the macro components to implement a network function accelerator.

6. The method of claim 1, wherein:
the first operating metric represents a cache miss rate for a cache implemented in one of the FPGA devices;
the first change in the first operating metric results in the cache miss rate exceeding a threshold for the cache miss rate; and
the method further comprises implementing the system function by programming the first portion of the macro components to increase the capacity of the cache.

7. The method of claim 1, further comprising:
implementing the system function by programming the first portion of the macro components; and
causing a second change in the operating metric by executing the system function, wherein the second change opposes the first change.

8. The method of claim 7, further comprising:
prior to programming the first portion of the macro components,
saving a context for the one or more user functions, and
migrating the one or more user functions to a second portion of the plurality of macro components.

9. The method of claim 1, further comprising:
in response to a second change in the first operating metric, deallocating the first portion of the macro components, wherein the second change opposes the first change, and
generating a second notification indicating the deallocation of the first portion.

10. A controller device, comprising:
monitoring logic configured to monitor a first operating metric for one or more computing devices;
allocation logic coupled with the monitoring logic and configured to
identify a first portion of a plurality of macro components of a set of one or more field programmable gate array (FPGA) devices in the one or more computing devices, wherein a first portion of the plurality of macro components is allocated for implementing one or more user defined functions, and
in response to a first change in the first operating metric, reallocate the first portion of the macro components for implementing a system function associated with the first operating metric; and
notification logic coupled with the allocation logic and configured to generate a first notification indicating the reallocation of the first portion.

11. The controller device of claim 10, wherein:
the first operating metric is one of a plurality of operating metrics for the one or more computing devices;
the monitoring logic is further configured to, for each operating metric of the plurality of operating metrics, monitor the operating metric by
comparing the operating metric with a threshold for the operating metric, and
detecting a change in the operating metric when the operating metric exceeds the threshold; and
the controller device further comprises a register configured to store the threshold.

12. The controller device of claim 10, further comprising:
comparison logic configured to determine whether a total number of macro components allocated for implementing the system function is less than an allocation limit, wherein the total number of macro components includes the first portion of the plurality of macro components and a second portion of the macro components previously allocated for the system function,
wherein the allocation logic is further configured to perform the reallocating in response to the comparison logic determining that the total number of the macro components is less than the allocation limit.

13. The controller device of claim 10, further comprising migration logic coupled with the allocation logic and configured to, prior to the reallocating of the first portion of the macro components:
save a context for the one or more user functions, and
migrate the one or more user functions to a second portion of the plurality of macro components,
wherein
the allocation logic is further configured to, after the reallocating and in response to a second change in the first operating metric, deallocate the first portion of the macro components, wherein the second change opposes the first change, and
the notification logic is further configured to generate a second notification indicating the deallocation of the first portion.

14. The controller device of claim 10, further comprising configuration logic coupled with the allocation logic, wherein the configuration logic is configured to:
implement the system function by programming the first portion of the macro components; and
causing a second change in the operating metric by initiating execution of the system function, wherein the second change opposes the first change.

15. The controller device of claim 10, wherein the first operating metric represents one of:
a data error rate for data received at one or more of the FPGA devices;
a network traffic volume processed by the one or more computing devices; and
a cache miss rate for a cache implemented in the one of the FPGA devices.

16. The controller device of claim 10, wherein the monitoring logic is further configured to, for each operating metric of a plurality of operating metrics including the first operating metric:
store a threshold corresponding to the operating metric; and
compare the operating metric with the threshold,
wherein the first change in the first operating metric results in the first operating metric exceeding the threshold corresponding to the first operating metric.

17. A computing system, comprising:
a set of one or more field programmable gate array (FPGA) devices in one or more computing devices;
a macro scheduler coupled with the set of FPGA devices and configured to allocate a portion of a plurality of macro components in the set of FPGA devices for implementing one or more user defined functions; and
a controller device coupled with the set of FPGA devices and configured to
monitor a first operating metric for the one or more computing devices,
in response to a first change in the first operating metric, reallocate the portion of the macro components for implementing a system function associated with the first operating metric, and
generate a first notification indicating the reallocation of the portion.

18. The computing system of claim 17, wherein the controller device resides on a first FPGA device in the set of FPGA devices.

19. The computing system of claim 17, wherein the controller device is further configured to transmit the first notification to the macro scheduler.

20. The computing system of claim 17, wherein the macro scheduler is further configured to:
   receive from a client device a design definition indicating one or more specified macro components for a design; and
   implement the design in the set of FPGA devices by configuring the portion of the macro components according to the first design definition, wherein the portion includes the one or more specified macro components.

21. The computing system of claim 17, further comprising:
   one or more client devices configured to receive a user selection of a design definition for each of the one or more user defined functions; and
   a communication network coupling the one or more client devices with the one or more computing devices.

* * * * *